US012699117B2

(12) United States Patent
May

(10) Patent No.: US 12,699,117 B2
(45) Date of Patent: Aug. 4, 2026

(54) ACTIVE PROBE FOR MEASURING VOLTAGE AT HIGH IMPEDANCES

(71) Applicant: ATEQ, Les Clayes-sous-Bois (FR)

(72) Inventor: Thierry May, Les Clayes-sous-Bois (FR)

(73) Assignee: ATEQ, Les Clayes-sous-Bois (FR)

( * ) Notice: Subject to any disclaimer, the term of this patent is extended or adjusted under 35 U.S.C. 154(b) by 131 days.

(21) Appl. No.: 18/696,973

(22) PCT Filed: Sep. 28, 2022

(86) PCT No.: PCT/EP2022/077075
§ 371 (c)(1),
(2) Date: Mar. 28, 2024

(87) PCT Pub. No.: WO2023/052482
PCT Pub. Date: Apr. 6, 2023

(65) Prior Publication Data
US 2025/0035679 A1       Jan. 30, 2025

(30) Foreign Application Priority Data
Sep. 30, 2021    (FR) ....................................... 2110332

(51) Int. Cl.
*G01R 19/00*          (2006.01)
*G01R 15/12*          (2006.01)
(52) U.S. Cl.
CPC ....... *G01R 19/0023* (2013.01); *G01R 15/125* (2013.01)

(58) Field of Classification Search
CPC ............ G01R 1/06766; G01R 1/06788; G01R 15/125; G01R 19/0023; G01R 19/16561;
(Continued)

(56) References Cited

U.S. PATENT DOCUMENTS 4,042,881 A * 8/1977 Webb, Jr. ............... G01R 29/00
324/123 R
4,298,837 A    11/1981 Koslar
(Continued)

OTHER PUBLICATIONS

Noras, "Ultra high impedance voltmeter for electrostatic applications", Conference Record of the 2005 IEEE Industry Applications Conference Fortieth IAS Annual Meeting, Oct. 2-6, 2005, Kowloon, Hong Kong, China, IEEE Cat., vol. 3, Oct. 2, 2005 (Oct. 2, 2005), pp. 2194-2197. DOI: 10.1109/IAS.2005.1518751, 2005.

*Primary Examiner* — Vinh P Nguyen
(74) *Attorney, Agent, or Firm* — Dierker & Kavanaugh, P.C.

(57)          ABSTRACT
An active probe (1) for measuring a voltage across a high value impedance, the active probe (1) including: an impedance matching circuit (10) configured to have an input impedance at least 100 times higher than the impedance to be measured, and to deliver a low impedance signal at the output; a probe tip (6) configured to take a measurement and connected to the impedance matching circuit (10); a ground reference (G) connected to the impedance matching circuit (10); the impedance matching circuit (10) including, connected in cascade, at least one input circuit (14) and a non-inverting amplifier circuit (16) adapted to high impedance values.

10 Claims, 2 Drawing Sheets

(58) Field of Classification Search
 CPC . G01R 1/06; G01R 1/067; G01R 1/24; G01R
 31/2853; G01R 31/2855; G01R 31/2872;
 G01R 31/001; G01R 29/0878; G01R
 27/02; H01R 13/2407; H01R 13/2464;
 H01R 13/6473; H01R 13/6608; H01R
 13/719; H03H 7/38
 See application file for complete search history.

(56)                  References Cited

U.S. PATENT DOCUMENTS

| | | | |
|---|---|---|---|
| 4,527,118 A | 7/1985 | Koslar | |
| 5,952,820 A * | 9/1999 | Thrasher | G01R 19/155 |
| | | | 324/133 |
| 6,274,336 B1 * | 8/2001 | Abdel-Meguid | C07D 277/56 |
| | | | 435/23 |
| 6,552,565 B2 * | 4/2003 | Chang | H04L 25/0278 |
| | | | 326/83 |
| 6,724,205 B1 * | 4/2004 | Hayden | G01R 1/06766 |
| | | | 324/754.07 |
| 8,513,939 B2 * | 8/2013 | Hanawa | H05H 1/0081 |
| | | | 324/72.5 |
| 9,063,191 B2 * | 6/2015 | Whisenand | G01R 31/52 |

* cited by examiner

[Fig. 1]
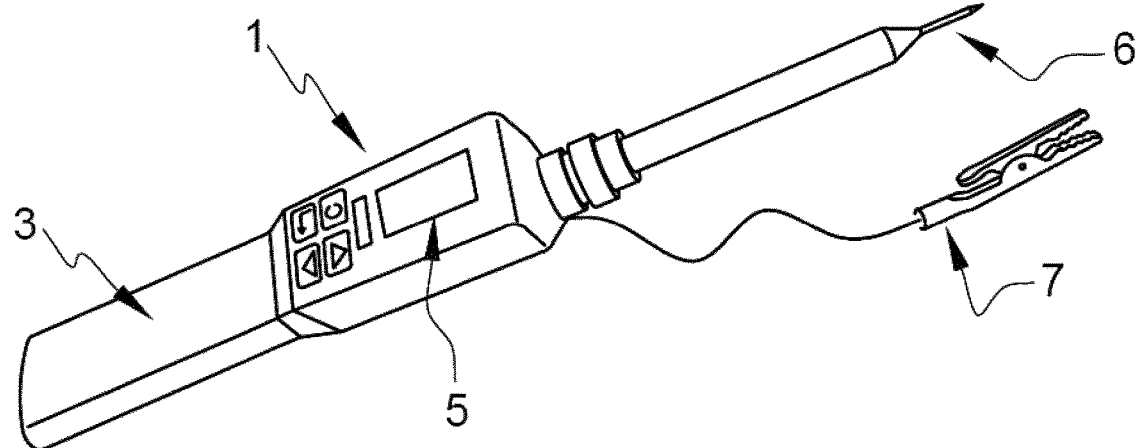
[Fig. 2]
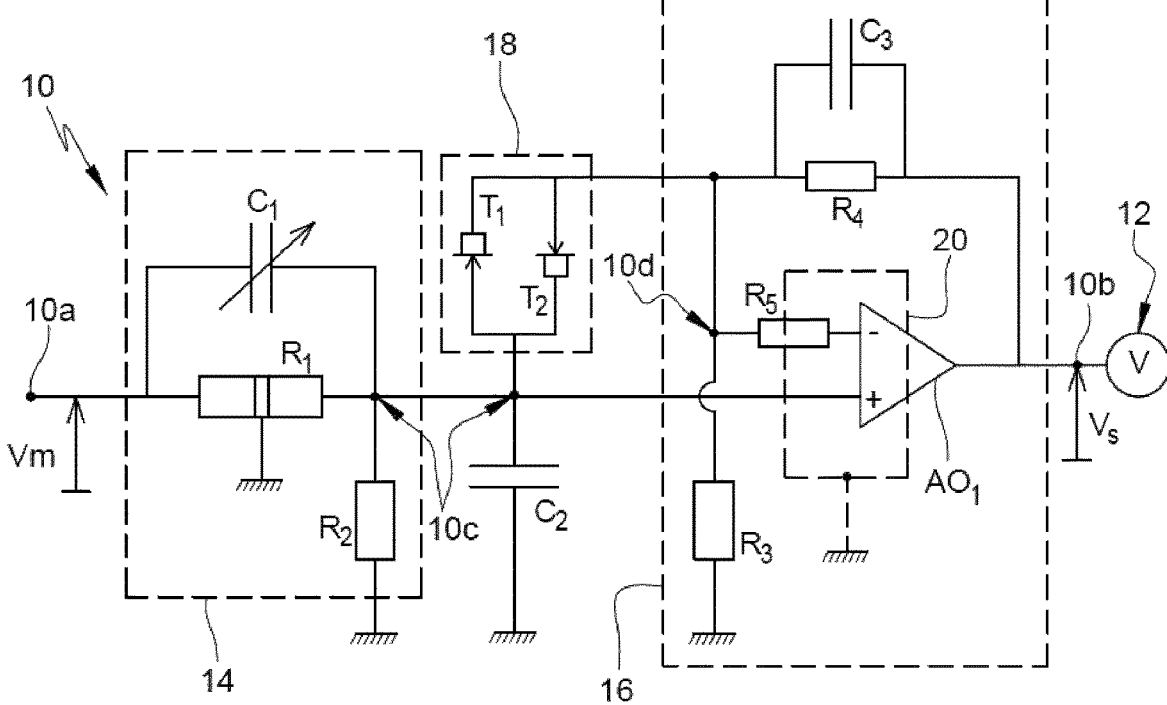
[Fig. 3]
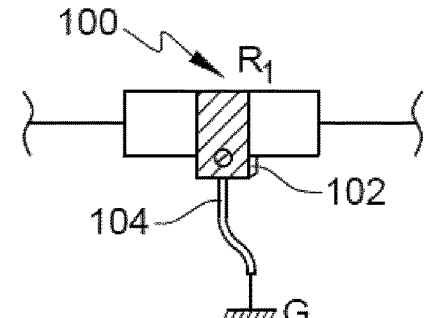

[Fig. 4]

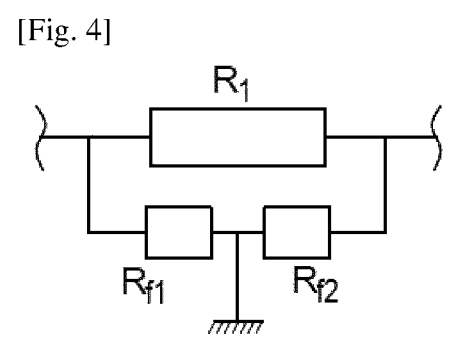

ACTIVE PROBE FOR MEASURING VOLTAGE AT HIGH IMPEDANCES

The present invention relates to the field of measuring electrical quantities on electronic circuits, more particularly circuits that have high impedances and are subjected to high voltages, and in particular to a probe configured to perform such measurements.

In the field of impedance and/or voltage measurements, it is conventional to use a multimeter to perform this type of measurement. Unfortunately, commercially available multimeters have an insufficient input impedance, i.e. in the order of about ten megohms, compared with the impedances of the circuits for which measurements are to be made.

Indeed, said multimeters do not allow correct voltage measurements to be made, especially when the impedance of the circuit for which the measurement is being made is in the order of about ten megohms or more. In particular, the multimeter modifies the impedances it is trying to measure, resulting in an incorrect measurement.

This relates in particular to impedance measurements to be carried out when designing the high-voltage supply and/or power supply regulation circuit, for example a mass spectrometer, a dielectrimeter, a megohmmeter . . . (and generally any circuit with a high-voltage application). These circuits generally have resistor divider bridges which have an impedance of more than ten megohms and voltages at their terminals of in the order of a hundred volts or more. This type of application makes it necessary to have a high-performance measuring device, which does not produce significant errors in its measurements.

Furthermore, to carry out such measurements, it is generally necessary to have probes connected to a multimeter by means of measurement cables. These cables generate noise and risk the formation of capacitive coupling loops which will affect the accuracy of the measurement.

The present invention thus makes it possible to overcome one or more of the aforementioned problems and obtain a measurement accuracy that is equal to or less than 1%.

The invention is thus an active probe for measuring voltage across a high-value impedance, said probe comprising:

- an impedance matching circuit configured, on the one hand, to have an input impedance at least 100 times higher than the impedance to be measured and, on the other hand, to deliver a low impedance signal at the output;
- a probe tip configured to take a measurement and connected to said impedance matching circuit;
- a ground reference connected to said impedance matching circuit;

said impedance matching circuit comprising, in cascade, at least one input circuit and a non-inverting amplifier circuit adapted to high impedance values.

A probe according to the invention providing an impedance matching circuit thus makes it possible to carry out high impedance measurements and to obtain the measured value at a low impedance output, making it possible in particular to avoid disruptive phenomena (such as capacitive and inductive couplings, as well as parasitic electromagnetic fields).

The low impedance signal may be in the order of ten ohms for example.

According to another possible feature, the low impedance output of said impedance matching circuit has an impedance that is equal to or less than 50 ohms.

According to another possible feature, said probe according to the invention comprises a casing, the impedance matching circuit and said probe tip being arranged, at least partially, in said casing.

According to another possible feature, said probe comprises a voltmeter connected to an output of the impedance matching circuit.

According to another possible feature, said impedance matching circuit is configured to be connected to an oscilloscope, in particular by means of an output intended to be connected to an oscilloscope.

The fact of being able to connect the output of said impedance matching circuit to an oscilloscope makes it easy to display the voltage measured by the probe according to the invention.

According to another possible feature, said probe comprises a battery, arranged in the casing for example. This configuration makes it possible in particular to have an autonomous probe, which is easy to handle and transport.

According to another possible feature, the input impedance and the output impedance of the impedance matching circuit have a ratio that is greater than or equal to 1000, and preferably greater than or equal to 5000 (the input impedance is therefore very much higher than the output impedance).

According to another possible feature, said probe tip is directly connected to the said impedance matching circuit.

In particular, this arrangement of the probe elements makes it possible to have no or few cables between the measurement point and the circuit enabling the measurement. This also avoids the need to shield the cables and makes it possible to have more compact probe.

According to another possible feature, the non-inverting amplifier circuit comprises an operational amplifier AO1, as well as a resistor R5 arranged at the inverting input of said operational amplifier AO1.

According to another possible feature, the amplifier circuit comprises a guard ring surrounding the inverting and non-inverting inputs of the operational amplifier AO1 and at least partially the fifth resistor R5.

According to another possible feature, the impedance matching circuit comprises at least one component and/or a filter circuit.

According to another possible feature, the said at least one component and/or filter circuit comprises a resistor and/or a capacitor.

According to another possible feature, said probe is configured to measure a direct voltage and/or a voltage having a frequency of less than 60 Hz.

According to another possible feature, the probe according to the invention is configured to measure an impedance higher than 10 gigaohms (GΩ), preferably between 10 and 50 gigaohms (GΩ).

According to another possible feature, the impedance matching circuit has a transfer function H(p) including three poles and a zero.

According to another possible feature, the input circuit has an input impedance higher than 50 gigaohms (GΩ).

According to another possible feature, the input circuit comprises a divider bridge.

This divider bridge may in this case be a resistor divider bridge.

According to another possible feature, said input circuit comprises at least one resistor R1 including at least one guard ring fixed onto the body of said resistor R1.

According to another possible feature, the guard ring of said at least one resistor R1 comprises a stainless steel ring fixed to the middle of the resistor body and a metal braid connecting said ring to a ground G.

According to another possible feature, the input circuit comprises at least one capacitor C1.

Said capacitor C1 has advantageously a capacitance of between 1.5 and 55 picofarads.

According to another possible feature, the capacitor C1 of said input circuit is arranged in parallel with the resistor R1 of said divider bridge.

According to another possible feature, the capacitor C1 of said input circuit is a variable or adjustable capacitor, i.e. its capacitance can vary over a determined range, for example between 1.5 and 55 picofarads.

The capacitor C1 is a tuning capacitor and enables the damping of the circuit to be adjusted, in particular when the latter is subjected to an index regime (the aim being to avoid over-damping or under-damping and producing an incorrect measurement).

According to another possible feature, the impedance matching circuit comprises a surge voltage protection circuit.

According to another possible feature, said protection circuit comprises two diode-connected transistors, for example JFET (Junction Field Effect Transistor) type transistors.

It should be noted that the fact that a transistor, in particular a field effect transistor, is diode-connected means that the drain and the source are connected to one another (anode) and are considered as a single pole, and that the gate (cathode) is considered as the other pole.

The invention will be better understood and other aims, details, features and advantages thereof will become clearer in the following description of a particular embodiment of the invention, given solely by way of illustration and with no limitations, with reference to the accompanying drawings in which:

FIG. 1, referred to as [FIG. 1], is a highly schematic representation of a measurement probe according to the invention;

FIG. 2, referred to as [FIG. 2], is a schematic representation of the impedance matching circuit of the probe of FIG. 1;

FIG. 3, referred to as [FIG. 3], is a schematic and enlarged representation of a resistor in the circuit of FIG. 2, and FIG. 4, referred to as [FIG. 4], is an equivalent electrical schematic representation of the resistor of FIG. 3.

FIG. 1 is a highly schematic representation of an active probe 1 for measuring a voltage across a high impedance.

It should be noted that "high impedances" means impedances that are higher than 10 gigaohms (GΩ), and preferably impedances between 10 and 50 gigaohms (GΩ).

Said active probe 1 thus comprises a casing 3, a man-machine interface 5, integrated into the casing 3 for example, a probe tip 6 configured to take a voltage measurement, as well as a ground reference 7 connected to the probe tip 6 and intended to be connected to a reference ground G.

Said probe 1 comprises advantageously a battery (not shown) for powering various circuits and components of said probe 1, thus enabling it to be autonomous and not have to be connected to the mains when in use.

It should be noted that the term man-machine interface refers to all of the elements that enable the user to interact with the probe according to the invention, more particularly to control the probe according to the invention and exchange information with it.

The probe tip 6 ends in an electrically conductive part intended to be applied to the point of a circuit having a high impedance for which the voltage is to be measured, while reference 7 is for example in the form of an alligator clip.

It should be noted that the term "active probe" refers to the fact that the probe comprises one or more active components configured to process the measurement signal, which are located as close as possible to the probe tip 6, in particular in order to be as insensitive as possible to various disturbances and thus reduce measurement errors.

As illustrated in FIG. 2, said probe 1 thus comprises an impedance matching circuit 10 and a voltmeter 12. Said impedance circuit 10 has an input 10a corresponding to the tip 6 of the active probe 1, while the ground G of said circuit 10 is the ground to which reference 7 of said probe 1 is connected.

Said impedance matching circuit 10 comprises at least one input circuit 14, to which the input 10a is connected, and a non-inverting amplifier circuit 16 adapted to high impedance values, the output 10b of which is connected to the voltmeter 12 or to an oscilloscope input. The input circuit 14 and the amplifier circuit 16 are connected in a cascade.

The circuit 10 advantageously has an input impedance and an output impedance with a ratio greater than or equal to 1000, and preferably greater than or equal to 5000. The input impedance of said circuit 10 is therefore very high compared with the output impedance of the circuit 10.

Said at least one input circuit 14 comprises more particularly a circuit of the resistive voltage divider bridge type (or "divider bridge"). Said divider bridge thus comprises at least two resistors R1 and R2 (suitably arranged), also referred to respectively as a first resistor R1 and second resistor R2.

It should also be noted that the input circuit 14 has an input impedance higher than 50 gigaohms (GΩ).

The second resistor R2 is a foot resistor, one end of which is connected to ground G, while the first resistor R1 is connected, on the one hand, to the input 10a, and on the other hand, to the second resistor R2. One of the ends of the resistors R1 and R2 being connected to the output 10c of the divider bridge (the output 10c of the divider bridge also corresponding to the input of the circuit 16).

Said input circuit 14 also comprises a capacitor C1 (also referred to as the first capacitor), preferably variable or adjustable, the value of the capacitance of the capacitor C1 being able to vary over a given range of intervals. The capacitor C1 advantageously has a capacitance value of between 1.5 and 55 picofarads.

Said capacitor C1 is also arranged in parallel to the resistor R1 of the divider bridge. Said capacitor C1 is therefore connected, on the one hand, to the input 10a, and, on the other hand, to the output of the divider bridge 10c.

It should be noted that the impedance matching circuit 10 may also comprise a capacitor C2, also referred to as a second capacitor, arranged in parallel to the second resistor R2 of the divider bridge.

This second capacitor C2 makes it possible in particular to filter the harmonics and/or reduce the noise present at the input 10a of the probe 1, said capacitor C2 therefore acts as a filtering component.

Said amplifier circuit 16, thus comprises an operational amplifier AO1, at least three resistors R3, R4 and R5, as well as a capacitor C3. These elements are also referred to respectively as a third resistor R3, fourth resistor R4, fifth resistor R5 and third capacitor C3.

The output 10*c* of the input circuit 14 is connected to one of the inputs of the amplifier circuit 16, and more particularly to the non-inverting input of the operational amplifier AO1.

The third resistor R3 is connected to the ground G at one of its ends, while the other end is connected to the inverting input of the operational amplifier AO1. The third resistor R3 can also be described as a foot resistor and contributes to the gain provided by the circuit 16 with the fourth resistor R4.

The fifth resistor R5 is arranged at the inverting input of the operational amplifier AO1. One end of the resistor R5 is therefore connected to the inverting input, while the other end is connected to a node 10*d*, the node 10*d* to which the third resistor R3 is also connected (as well as to the fourth resistor R4).

The fourth resistor R4 and the third capacitor C3, arranged in parallel with one another, are connected, on the one hand, to the node 10*d*, and, on the other hand, to the output of the operational amplifier AO1 (the output of the amplifier AO1 corresponding to the output 10*b* of the impedance matching circuit 10).

It should be noted that the association of the fourth resistor R4 and third capacitor C3 in parallel to the said fourth resistor R4 (and its position in the impedance matching circuit 10) is a filter circuit making it possible in particular to filter the noise associated with the amplification of the (measured) signal.

Advantageously, the operational amplifier AO1 is an operational amplifier of the CMOS (Complementary Metal Oxide Semiconductor) type, this type of amplifier having very low input currents, of in the order of about ten femtoamperes.

The amplifier circuit 16 also comprises a guard ring 20 surrounding the inverting and non-inverting inputs of the operational amplifier AO1 and (at least) partially the fifth resistor R5. Said guard ring 20 prevents in particular the migration of leakage currents to other components of the circuit 10 where there is a potential difference. The guard ring 20 is also connected to the ground G of the impedance matching circuit 10.

The guard ring 20 is for example a metal strip, such as copper, placed on the printed circuit board (PCB) on which the electronic components are arranged. This guard ring 20 makes it possible in particular to protect the elements that it surrounds from parasitic leakage currents.

In addition, the impedance matching circuit 10 comprises advantageously a surge voltage protection circuit 18.

Said protection circuit 18 comprises two diode-connected transistors T1 and T2, for example JFET type transistors. It is particularly advantageous to use transistors of this type, as they have very low leakage currents which will not interfere with the measurements.

The impedance matching circuit has a transfer function H(p) including three poles and a zero, more particularly the transfer function has the following form:

$$H(p) = H_0 \left( \frac{1 + \dfrac{p}{\omega_1}}{1 + \dfrac{p}{\omega_2}} \right) \left( \frac{1 + \dfrac{p}{\omega_Z}}{1 + \dfrac{p}{\omega_3}} \right)$$

with $$H_0 = \left( \frac{R_2}{R_1 + R_2} \right) \left( 1 + \frac{R_3}{R_4} \right);$$

-continued $$\omega_1 = \frac{1}{R_1 C_1};$$

$$\omega_2 = \frac{1}{(R_1 /\!/ R_2)(C_2 + C_p)};$$

$$\omega_3 = \frac{1}{R_4 C_3};$$

$$\omega_z = \frac{1}{(R_3 /\!/ R_4) C_3};$$

where $C_p$ is the input capacitor of the operational amplifier AO1; $\omega_1$, $\omega_2$, $\omega_3$ and $\omega_z$ are the pulsations (generally referred to as "cut-off pulsations") relative to the poles and zero of the transfer function H(p) of the circuit 10.

Advantageously, the pulsations $\omega_1$ and $\omega_2$ are equal, pulsation $\omega_3$ is largely greater than $\omega_1$ and $\omega_2$ respectively, while the pulsation $\omega_z$ is greater than $\omega_3$ (advantageously at least a ratio of 10, and preferably at least a ratio of 50). It should be noted that "largely greater", means at least a ratio of 100 between the pulsation $\omega_3$ and the pulsations $\omega_1$ and $\omega_2$.

Said probe 1 is thus configured to measure a direct voltage and/or a voltage having a frequency of less than 60 Hz.

As illustrated more particularly in FIGS. 2 and 3, the first resistor R1 comprises advantageously a guard ring 100 fixed to the body of said resistor R1.

Thus, the guard ring of said at least one resistor R1 comprises a stainless steel ring 102 fixed to the middle of the body of the resistor R1 and a metal braid 104 connecting said ring to a ground G.

As shown in the equivalent electrical diagram in [FIG. 4], the guard ring makes it possible to break down the leakage resistance $R_f$ of the resistor R1 into two leakage resistances $R_{f1}$ and $R_{f2}$ arranged parallel to one another, thereby greatly reducing the leakage resistance associated with the resistor R1.

The invention claimed is:

1. An active probe for measuring a voltage across a high-value impedance of at least 10 gigaohms (GΩ) of an electronic circuit, said probe comprising:

an impedance matching circuit configured, on the one hand, to have an input impedance at least 100 times higher than the high-value impedance of the electronic circuit on which the voltage is measured and, on the other hand, to deliver a low impedance signal at an output of the impedance matching circuit;

a probe tip configured to take a measurement and connected to said impedance matching circuit;

a ground reference connected to said impedance matching circuit; and said impedance matching circuit comprising, in a cascade, at least one input circuit and a non-inverting amplifier circuit adapted to high impedance values;

wherein the non-inverting amplifier circuit comprises:

an operational amplifier having inverting and non-inverting inputs;

a resistor arranged at the inverting input of said operational amplifier; and a guard ring surrounding the inverting and non-inverting inputs of said operational amplifier and, at least partially, the resistor at the inverting input of said operational amplifier.

2. The probe according to claim 1, wherein the low impedance output of said impedance matching circuit has an impedance that is equal to or less than 50 ohms.

3. The probe according to claim 1, wherein the impedance matching circuit comprises at least one component and/or a filter circuit.

4. The probe according to claim 1, wherein said probe is configured to measure a direct current (DC) voltage and/or a voltage having a frequency of less than 60 Hz.

5. The probe according to claim 1, wherein the probe is configured to measure the voltage of the electronic circuit having the high-value impedance between 10 gigaohms (GΩ) and 50 gigaohms (GΩ).

6. The probe according to claim 1, wherein the impedance matching circuit has a transfer function H(p) including three poles ($\omega_{1\text{-}3}$) and a zero ($\omega_z$).

7. The probe according to claim 6, wherein the input circuit has an input impedance higher than 50 gigaohms (GΩ).

8. The probe according to claim 1, wherein the input circuit comprises a divider bridge.

9. The probe according to claim 1, wherein said input circuit comprises at least one other resistor including at least one other guard ring fixed to a body of said at least one other resistor.

10. The probe according to claim 9, wherein the at least one other guard ring of said at least one other resistor comprises a stainless steel ring fixed to a middle of the body of the at least one other resistor and a metal braid connecting the at least one other guard ring to a ground.

* * * * *